United States Patent
Kobayashi (10) Patent No.: US 9,509,288 B2
(45) Date of Patent: Nov. 29, 2016

(54) VARIABLE PULSE WIDTH GENERATOR AND METHOD

(71) Applicant: Herbert S Kobayashi, Webster, TX (US)

(72) Inventor: Herbert S Kobayashi, Webster, TX (US)

(*) Notice: Subject to any disclaimer, the term of this patent is extended or adjusted under 35 U.S.C. 154(b) by 0 days.

(21) Appl. No.: 14/712,134

(22) Filed: May 14, 2015

(65) Prior Publication Data

US 2015/0249440 A1 Sep. 3, 2015

Related U.S. Application Data

(60) Division of application No. 13/647,649, filed on Oct. 9, 2012, now Pat. No. 9,059,644, and a continuation-in-part of application No. 12/506,478, filed on Jul. 21, 2009, now Pat. No. 8,427,084.

(60) Provisional application No. 61/681,226, filed on Aug. 9, 2012, provisional application No. 61/661,582, filed on Jun. 19, 2012.

(51) Int. Cl.
  *H03K 3/017* (2006.01)
  *H02M 7/5387* (2007.01)
  *H02M 7/527* (2006.01)

(52) U.S. Cl.
  CPC .......... *H03K 3/017* (2013.01); *H02M 7/53873* (2013.01)

(58) Field of Classification Search
  CPC .......................... H03K 3/017; H02M 7/53873
  USPC ................... 701/50, 1, 36; 323/282, 284
  See application file for complete search history.

(56) References Cited

U.S. PATENT DOCUMENTS

| | | | |
|---|---|---|---|
| 4,139,066 A | 2/1979 | Goodney et al. | |
| 4,208,991 A * | 6/1980 | Reddy | F02D 41/064 123/179.17 |
| 4,405,019 A | 9/1983 | Frisbee | |
| 4,505,339 A | 3/1985 | Kramer et al. | |
| 4,695,936 A * | 9/1987 | Whittle | H02M 1/36 363/21.1 |
| 5,010,961 A | 4/1991 | Frisbee | |
| 5,960,569 A | 10/1999 | Molstad | |
| 7,268,526 B1 * | 9/2007 | Smith | H02M 3/156 323/284 |
| 7,654,335 B2 | 2/2010 | Stratton | |
| 2002/0162668 A1 | 11/2002 | Carlson et al. | |
| 2006/0220626 A1 * | 10/2006 | Partridge | H02M 3/156 323/282 |
| 2009/0069987 A1 | 3/2009 | Omelchenko et al. | |
| 2014/0265899 A1 * | 9/2014 | Sadwick | H05B 33/0812 315/200 R |

* cited by examiner

*Primary Examiner* — Tan Q Nguyen
(74) *Attorney, Agent, or Firm* — Kenneth L. Nash (57) ABSTRACT

In one embodiment a dozer blade controller, which may comprise two-way, four-way, or six-way dozer blade position control such as, for example, a two-way control only for blade tilt. In one embodiment, a pulse width control is provided for use in a blade tilt electronic controller, which controls blade tilt independently of movement of the body of the bull dozer. And in another embodiment, a pulse width controller is operable to multiply and/or divide the width of a variable pulse by a preset multiplier factor or divider factor, e.g. by 100 or dividing by 100.

15 Claims, 3 Drawing Sheets

VARIABLE PULSE WIDTH GENERATOR AND METHOD

This application is a divisional application of U.S. patent application Ser. No. 13/647,649, filed Oct. 9, 2012, which claims benefit of U.S. Provisional Application No. 61/681,226 filed Aug. 9, 2012 and U.S. Provisional Application No. 61/661,582 filed Jun. 19, 2012, and a continuation in part application of U.S. patent application Ser. No. 12/506,478, filed Jul. 21, 2009. All of the above listed applications are incorporated herein by reference.

BACKGROUND OF THE INVENTION

1. Field of the Invention

The present invention relates generally to bull dozers and/or in one embodiment to pulse width modulation controllers, and in one possible embodiment, to a pulse width controller for hydraulics utilized with a blade position sensor, which is operable to control a dozer blade in the x, y, and z directions.

2. Description of the Background

The blade of a bull dozer is generally manually controlled hydraulically in x, y, and z directions. When utilizing a bull dozer to provide a constant angled surface, it is desirable to maintain a constant position of the bull dozer blade even though the bull dozer may often shift in position when moving through the terrain. Attempting to do this manually requires continuous vigilance and continuous adjustments. Prior art systems that provide this feature are expensive and difficult to implement. It would be desirable to provide a system with components costing less than $200, which if desired may even be built into the hydraulic controls of an existing bull dozer, as with a kit.

The following patents represent background art in motor controls of various types and show prior art attempts to solve the above and/or related problems as discussed above:

United States Patent Application 2002/0162668 to Carlson, David S. et al. published Nov. 7, 2002 for blade control apparatuses and methods for an earth-moving machine discloses a method and apparatus for providing for real time automated control of the position of a blade on an earth-moving machine. The method includes providing a geography altering machine, including a blade and a computer, the computer having stored therein a reference line and a three dimensional computer model of a desired topography, providing a user defined offset relative to the reference line, determining a blade position in local coordinates, converting the local coordinates to reference line coordinates, utilizing the reference line coordinates and the user defined offset to calculate blade movement commands, and moving the blade in a direction required by the blade movement commands.

U.S. Pat. No. 4,405,019 to Frisbee, issued Sep. 20, 1983, for adjustment and stabilizer mechanism for dozer blade, discloses a mechanism for angling, pitching, and tilting a dozer blade utilized in a conventional bulldozer wherein the blade is pivotally connected by an angling frame to the forward ends of push arms. A tilt-pitch control assembly for the blade is provided including a pitch cylinder, a pitch-tilt cylinder, a torsion bar, and drag link connections. The pitch cylinder and pitch-tilt cylinder are each pivotally attached to the torsion bar by the drag link connections. If a load is applied against one side of the blade, the load is transmitted to the pitch cylinder or pitch-tilt cylinder closest to the loaded side of the blade thereby causing some movement of that cylinder. The cylinder which is under load transmits any movement through its respective drag link connection into a turning movement on the torsion bar. This turning movement on the torsion bar is, in turn, transmitted to the opposite side of the blade and to the unloaded cylinder which provides support to the loaded cylinder for counteracting any uneven or undistributed loads on the blade. The pitch-tilt cylinder includes opposed extensible piston rods for providing maximum blade tilt at all pitch positions of the blade.

U.S. Pat. No. 5,010,961, to Frisbee, issued Apr. 30, 1991, for Angle-tilt-pitch mechanism for dozer blade, discloses a mechanism for connecting a ground-engaging blade to the frame of a vehicle is disclosed which allows the blade to tilt, pitch or angle relative to the frame. The disclosed arrangement includes a pair of hydraulic cylinders which control the tilting or pitching of the blade and a single hydraulic cylinder which controls the angling of the blade. The cylinders are all pivotally connected to an intermediate member which is pinned to the blade and guided through an arc on the frame by a guide bar formed on the frame. A single hydraulic circuit is disclosed which powers the pair of hydraulic cylinders to pitch or tilt the blade relative to the frame.

U.S. Pat. No. 4,139,066 to Goodney, et al., issued Feb. 13, 1979 for hydraulic tilt and pitch control for dozer blade discloses a hydraulic control for selectively effecting tilt and pitch movement of a dozer blade via selected operation of tilt and pitch control valves which are connected in parallel with each other in two conduit networks, the first being connected to a source of fluid under pressure and respective first work ports of a pair of double-acting hydraulic actuators and the second being connected to a reservoir and to respective second work ports of the actuators. A rotary flow divider is connected in the first conduit network so as to effect equal flow to and from the actuators during operation of the pitch valve and so as to prevent flow between the first work ports of the actuators.

U.S. Pat. No. 4,505,339 to Kramer, et al., issued Mar. 19, 1985, discloses a hydraulic control for a dozer blade with a hydraulic circuit for pitch and tilt control of a dozer blade attached to push arms on a vehicle with a pitch ram connected between one push arm and the blade and a dual actuator consisting of a second pitch ram and a tilt ram connected at their head ends. A pitch valve directs hydraulic fluid to and from the pitch rams with a diverter/combiner valve interposed therebetween to assure a flow of fluid either to said rams or from said rams at equal rates. Pilot-operated check valves hydraulically lock the pitch rams until opened by pressure directed from said pitch valve. Tilt and lift valves direct fluid pressure to and from the tilt ram and a lift ram respectively with regeneration capability for both tilt and lift functions.

U.S. Pat. No. 5,960,569 to Molstad, issued Oct. 5, 1999, for articulated dozer blade system for vehicles, discloses an articulated dozer blade system for vehicles for performing dozing operations using an articulated blade capable of a variety of blade configurations. The inventive device includes an articulated dozer blade portions pivotally mounted together and mounted to a central pivot member. The central pivot member is mounted to a support structure by a bifurcated pivot mounting comprised of spaced fork members having a pivot rod which passes through the outer walls of the central pivot member. Blade positioning members secure the blade portions at a user-selected setting.

U.S. Pat. No. 7,654,335, to Stratton, issued Feb. 2, 2010, for system and method for controlling an implement based upon a gear shift, discloses systems and methods for controlling an implement based upon a gear shift include a shift detector circuit which detects a direction of the gear shift and an implement controller circuit which adjusts an implement in response to the direction of the gear shift.

United States Patent Application 2008/0263912, to Gharsalli; Imed, et al., published Oct. 30, 2008, for an automated blade positioning system for positioning a work implement. The system has at least one actuator for actuating a movement of a work implement. The system also has at least one sensor associated with the at least one actuator and configured to sense at least one parameter indicative of a position and an orientation of the work implement. Furthermore, the system has a controller configured to automatically create a travel path for the work implement and guide the work implement in response to the data received from the at least one sensor, wherein the controller is further configured to automatically modify the travel path when detecting an imminent collision between the work implement and an obstacle.

United States Patent Application 2009/0069987 to Alexander, et al., published Mar. 12, 2009, for automatic blade control system with integrated global navigation satellite system and inertial sensors, assigned to TOPCON Positioning discloses method and apparatus for controlling the blade elevation and blade slope angle of a dozer blade. Elevation and slope angle measurements are calculated from measurements received from a global navigation satellite system (GNSS) antenna and an inertial measurement unit mounted on the dozer blade. The inertial measurement unit includes three orthogonally placed accelerometers and three orthogonally placed rate gyros. The measurements are processed by algorithms to calculate estimates of the blade elevation, blade vertical velocity, blade slope angle, and blade slope angular velocity. These estimates are then provided as inputs to a control algorithm which provides control signals to control a dozer hydraulic system which controls the blade elevation and blade slope angle.

U.S. Pat. No. 3,206,665, issued Sep. 14, 1965, to C. Burlingham, discloses a digital motor control servo system having a source of command pulses indicative of a desired motor speed, a source of feedback pulses indicative of actual motor speed, a reversible binary counter connected to those sources so as to accumulate the difference between the total number of pulses delivered by each source, control means for varying the motor speed in accordance with the accumulated count, and inhibition means connected between the sources and the counter to the output of the counter to prevent pulses from reaching the counter whenever the pulses would oversaturate the counter.

U.S. Pat. No. 3,612,974, issued Oct. 12, 1971, to Wolf et al., discloses a motor that generates first pulses having a frequency related to the speed of rotation of the motor, second pulses generated in response to the first pulses having durations at least greater than a minimum time duration, and third pulses generated and used to pulse drive the motor having durations related to the time differences between the terminations of the second pulses and the initiations of the first pulses.

U.S. Pat. No. 3,766,459, issued Oct. 16, 1973, to McIntosh et al., discloses a control system for a machine tool having a direct current motor capable of rotating the motor shaft in a series of discrete steps through a range and maintaining the shaft in position between the steps. The motor is controlled by a digital to analog converter which receives an input having a bi-directional digital counter. A pulse generator inputs a preselected number of pulses in a preselected direction. An encoder responsive to the angular position of the motor shaft produces a fixed number of pulses for a given rotation, and the pulses count the counter in a direction related to the direction of movement of the motor shaft. Circuitry is provided both to match a directional signal with each pulse to control the counter direction and also for buffering all of the pulses to prevent more than one pulse from reaching the bi-directional digital counter at substantially the same time.

U.S. Pat. No. 3,858,100, issued Dec. 31, 1974, to Bussi et al., discloses a digital phase control adjustment system for a D.C. motor which finds particular utility in applications where fast start and stop operations of the motor are required. The pulses forming a reference signal and those forming a variable signal are stored sequentially in a shift register and when the shift register is alternately storing ones and zeros, the pulses of the two signals are in alternate sequence for a certain number of periods, indicating that the motor speed is near the intended value.

U.S. Pat. No. 3,898,545, issued Aug. 5, 1975, to Coppa et al., discloses a motor control circuit for maintaining a d-c electric motor at a constant speed, including a speed sensing means connected to the d-c electric motor to generate motor pulses whose duration is inversely proportional to the speed of the d-c electric motor, a bistable means for providing a continuous drive signal to the d-c electric motor and responsive to the application of the motor pulses and to the application of reference pulses generated by the motor pulses. The bistable means drives the d-c electric motor as long as the fixed duration of the reference pulses is shorter than the duration of the motor pulses being generated due to the rotation of the armature of the electric motor. Delay means are provided in the circuit to prevent ambiguity at the bistable means due to the simultaneous application of both the motor pulses and reference pulses to the bistable means.

U.S. Pat. No. 3,942,084, issued Mar. 2, 1976, to Louth, discloses a motor drive and servo systems particularly useful in high quality broadcast video tape recorders. A sine/cosine drive for a brushless DC motor permits high motor efficiency in a system adapted for use in a servo loop. A technique for phase locking a pair of frequency related phase locked control variable signals to a pair of frequency related reference signals, horizontal and vertical sync signals, for example, provides the advantages and precision of closed loop correction at widely variable correction rates. More accurate tape shuttling in a VTR is provided by running a DC motor in a phase locked loop as a synchronous motor and more accurate stopping of the tape is provided by comparing the capstan speed to ground in a closed loop. Improved tape tension control in the head area is provided by a pair of vacuum columns controlled by an error signal derived from the peak-to-peak tension error.

U.S. Pat. No. 4,008,424, issued Feb. 15, 1977, to G. Bompani, discloses an error voltage signal which is of magnitude related to the difference between the actual speed of a D.C. motor and a desired speed that is selectively applied to either the inverting input terminal of an operational amplifier or to its non-inverting input terminal, dependent upon the direction of rotation of the motor. The circuit components connecting the error signal to the input terminals are selected to provide the same absolute value of gain for the amplifier regardless of whether the input is to the inverting terminal or to the non-inverting terminal. The system substantially reduces complexity and diminishes the number of components required for this type of bidirectional speed regulation.

U.S. Pat. No. 4,100,012, issued Jul. 11, 1978, to Meihofer et al, discloses a web splicing apparatus that employs a pair of driven nip rolls which controllably feed web from a running roll into a festoon as web is drawn out of the festoon at a constant rate by a downstream web consuming machine. The nip rolls are driven by a DC motor connected in a closed loop servo system which compares the speed of the web entering the festoon with the web line speed to develop a command signal for the motor. During normal operation, the command signal includes a web velocity trim signal developed by monitoring the position of the festoon dancer relative to a selected reference position so as to minimize tension upsets and to maintain the dancer within its control range. During a splice sequence, the command signal comprises a deceleration ramp having a selected slope to provide controlled deceleration of the web to minimize tension upsets and to permit actuation of the splicing nips prior to actual web stop. After the splice is made, the command signal comprises an acceleration ramp whose slope is automatically adjusted to apply the least necessary tension to the ready web for new roll acceleration consistent with a given splicing speed. Further with this arrangement, the gain of the system is independent of the changing size of the expiring roll.

U.S. Pat. No. 4,145,644, issued Mar. 20, 1979, to R. Liu, discloses a stepping motor control circuit permitting selective operation of the motor in various modes such as half or full step mode. The circuit includes a pulse generator producing pulses at a selected motor step rate. A switch means selects the step size while a second switch selects the motor direction. An up/down counter counts pulses from the pulse generator in a direction correlated with the selected rotation direction. A read-only-memory is addressed as a function of the periodically repeating count in the up/down counter and the selected step size. The stored information at the addressed read-only-memory location actuates motor drive circuitry which generates energizing signals for the motor windings to drive the motor in the selected direction a distance corresponding to the selected step size at a step rate equal to the pulse rate of the pulse generator.

U.S. Pat. No. 4,205,260, issued May 27, 1980, to Maeda et al., discloses a motor control system including a clock pulse generator. Use is made of the clock pulses for deriving digitally, the speed-above-normal signal, the starting signal, the brake-release signal and the normal or forward rotation signal for displaying the normal or forward rotation. In response to the starting signal, 100% torque control voltage is generated and in case of the forced reversal in rotation, 100% torque control voltage for preventing the rotation in the reverse direction is generated.

U.S. Pat. No. 4,295,082, issued Oct. 13, 1981, to Moto et al., discloses a motor servo circuit. The motor in the motor servo circuit is driven by an output which is obtained by logically adding output pulses of a pulse stretcher circuit which stretches a pulse width of error pulses generated from an OR circuit when pulses inputted to the motor servo circuit and pulses outputted from a pulse generator in response to the input pulses are different in the pulse width to pulses having a predetermined pulse width which are generated at intervals of a predetermined member of the error pulses synchronizing therewith.

U.S. Pat. No. 4,409,529, issued Oct. 11, 1983, to Basford et al., discloses a prosthesis comprising: (a) a gripping member; (b) an operating lever mounted to pivot about a pivot axis and operatively connected to the gripping member; (c) a power unit including an electric motor, and a drive shaft rotatable by the electric motor; (d) means connecting the drive shaft to the operating lever at a region spaced from the pivot axis of the operating lever, the connecting means being constructed so that when the drive shaft rotates the connecting means (and also the region of the operating lever connected to the shaft) travels axially along the shaft thereby causing the operating lever to pivot about its pivot axis; and (e) means pivotally mounting the power unit to allow the connecting means to move along an arcuate path about the pivot axis during pivoting of the operating lever.

U.S. Pat. No. 4,651,269, issued Mar. 17, 1987, to K. Matsumura, discloses a circuit for reversing an electric current flow comprising a motor, a circuit formed of a first transistor at a power source side and a third transistor at the ground side which are connected in series, a circuit formed of a second transistor at the power source side and a fourth transistor at the ground side which are connected in series, the junction of the first and third transistors being connected to one terminal of the motor and the junction of the second and fourth transistors being connected to the other terminal of the motor, and a pulse generator for producing an output signal which delays the turn-on timing of the third or fourth transistor until the state of the first or second transistor has been changed from an on-state to an off-state.

U.S. Pat. No. 4,693,583, issued Sep. 15, 1987, to Ogihara et al., discloses a programmable shutter of the type wherein a shutter blade is opened and closed by means of a stepping motor. The motor is rotated in a forward direction by drive pulses of a predetermined fixed period to gradually open a sector while at the same time a light measuring circuit is started. Thus, at the time when an appropriate exposure quantity is reached, the direction of rotation of the motor is forcibly reversed to effect closing of the sector to attain simultaneous measurement of light and exposure.

U.S. Pat. No. 4,703,244, issued Oct. 27, 1987, to Takeuchi et al., discloses a frequency divided pulse produced by frequency dividing a clock signal by speed instruction data. When the current position of the pulse motor has not yet reached a set desired position, a frequency divided pulse is outputted as a forward rotation control pulse. When the current position has exceeded said set position, a frequency divided pulse is outputted as a reverse rotation control pulse. If the set desired position is changed while the pulse motor is rotating, this change of setting is detected and the output of the frequency divided pulse is inhibited for a predetermined settling period of time, thereby stopping the pulse motor. After the vibration of the rotor which occurs during the stepping of the pulse motor is settled, the reverse rotation of the pulse motor can be started, thereby preventing the occurrence of the step-out phenomenon of the pulse motor upon reverse rotation.

U.S. Pat. No. 5,334,924, issued Aug. 2, 1994, to Kawada et al, discloses that speed control of an induction motor is effected in digital fashion through use of a computer but without complex processing, and with a computer that need not be large in scale. This is accomplished by processing at least a speed command signal, actual speed signal and torque signal in analog fashion, enabling simplification of an induction motor speed control digital processing section which performs all other control operations in a digital manner. In a speed control network having a closed loop, a frequency-to-voltage converter, adder-subtractor, proportional integrator, polarity determining circuit absolute value circuit and voltage-to-frequency converter are constructed of circuitry operable on the basis of analog values, with all other circuits being constructed of circuitry operable on the basis of digital values.

U.S. Pat. No. 5,729,067, issued Mar. 17, 1998, to Janutka, discloses an improved method and servo control apparatus for controlling the motion of a linear electric motor which in turn generates motion command signals to various apparatus such as a hydraulic steering system. Preferably, the servo control apparatus includes a power supply circuit, a servo amplifier circuit, a pulse width modulation circuit, an H-bridge drive circuit and an inductive position sense circuit. The voltage at a node between coil pairs in the motor is sensed and synchronously demodulated using transmission gates to develop a DC signal representative of armature position from a center location. The signal on a current shunt resistor is synchronously demodulated by transmission gates to generate a signal, the phase of which is determined with respect to the motor drive signal. The phase signal directly indicates whether the armature is off center towards drive coil or drive coil.

U.S. Pat. No. 6,018,200, issued Jan. 25, 2000, to Anderson et al, discloses the throttle of an engine in an engine driven generator system operating subject to a wide and rapidly variable load, as in supplying current to a welder, is operated such that control signals are sent to a throttle actuator for adjusting the engine throttle position in response to load changes. The throttle actuator may be a solenoid pulling against a spring in accordance with the average current through the solenoid coil. In this embodiment, the processor causes pulse width modulated signals to be applied across the solenoid coil with throttle position changes being reflected in changes to the width of the pulses, such changes in the pulse width being delayed for at least the predetermined time since the last preceding adjustment to the throttle. Alternatively, the throttle actuator may be a stepper motor which is stepped by throttle position change signals from a processor which monitors engine speed and generator load to determine whether the throttle should be adjusted and, if so, in which direction and to what extent for optimum response.

U.S. Pat. No. 6,051,943, issued Apr. 18, 2000, to Rabin et al, discloses a motor control system employing a single Hall sensor providing a position feedback signal to a control circuit. The control circuit includes a tach counter circuit, a ramp mode circuit, an interpolation circuit, and a commutation logic circuit. Drive signals are output to the motor windings by the commutation logic circuit. The control state defining the drive signals is advanced on the basis of the estimated rotor position. The estimate of the rotor position is determined by linearly interpolating between Hall signal transitions.

U.S. Pat. No. 6,058,081, issued May 2, 2000, to Schell et al, discloses an optical drive system that includes an objective lens subassembly for directing light from a light source toward an information storage medium. An amount of the directed lighted light is returned from the storage medium. An objective lens is disposed in the objective lens subassembly. A first servomotor moves, during focus capture, the objective lens to a first position, away from the first position toward the storage medium being read while looking for a maximum Quad Sum signal, and back away from the storage medium. An electronic control circuit is connected to the first servomotor. A servo error detector is coupled to the electronic control circuit and disposed in a path of light returning from the information storage medium. The servo error detector is implemented to determine when total light returned from the information storage medium exceeds a predetermined value, to search for a first zero crossing, corresponding to when the Quad Sum signal exceeds a predetermined amplitude, and to indicate to the electronic control circuit to direct close of focus when the Quad Sum signal exceeds the predetermined amplitude.

U.S. Pat. No. 6,064,172, issued May 16, 2000, to Kuznetsov, discloses a winding fault detection system that provides classification and identification of winding faults or winding malfunctions. The fault detection system provides signals to individual electronic switches for segmented primary windings each having an electrical phase and grouped into sub-phases which are individually switch into or out of an excitation supply or isolated through the electronic switching in response to signals from the winding fault detection system. Each primary winding forms an electrical member which includes a stator having a polyphase winding, and there is a secondary electrical member magnetically coupled with the stator. Each primary has magnetic field sensors which detect phase angle and magnitudes of radial components of air gap flux by magnetic measurement probes between each secondary electrical member and each primary electrical member and derives an electrical signal for a component of air gap flux contributing to electromagnetic torque at each position of each stator's periphery. Additionally, the system instantaneously stores data continuously derived from the magnetic sensors and determines a hierarchy of fault detection schemes.

U.S. Pat. No. 6,069,857, issued May 30, 2000, to Schell et al, discloses an optical disc drive system that is employed in conjunction with a storage medium having a plurality of data sectors each provided with a header and a data storage area. The system includes a data detection device for retrieving stored data from the storage medium and outputting a data signal, an amplifier for providing a variable gain to the data signal and outputting an amplified data signal, a detector that is responsive to the amplified data signal for evaluating a predetermined one of the sectors to ascertain whether the storage area is blank, and an automatic gain control circuit producing a gain control output for controlling the gain of the amplifier. The control circuit has a first mode and a second mode, the first mode being active during retrieval of the header and the second mode being active during retrieval of the data storage area. The system is further provided with a sampling device for sampling the gain control output during retrieval of the stored data in a respective one of the storage areas containing previously stored data. The sampling device outputs results of the sampling, and a fixed gain control circuit is responsive to the results of the sampling for outputting a fixed gain control signal. The fixed gain control signal is applied to the amplifier during evaluation of the predetermined one of the sectors.

It would be desirable to provide a low power dissipation control system without the disadvantages of the systems discussed above. Consequently, there remains a long felt need for an improved motor speed and direction control system. Those skilled in the art have long sought and will appreciate the present invention which addresses these and other problems.

SUMMARY OF THE INVENTION

It is an object of the present invention to provide an improved motor control for a dozer blade.

It is another object of the present invention to provide a stable, energy efficient, servo control system.

These and other objects, features, and advantages of the present invention will become apparent from the drawings, the descriptions given herein, and the appended claims. However, it will be understood that above-listed objectives and/or advantages of the invention are intended only as an aid in quickly understanding aspects of the invention, are not intended to limit the invention in any way, and therefore do not form a comprehensive or restrictive list of objectives, and/or features, and/or advantages.

In one possible embodiment, a right tilt, left tilt, null control for a dozer blade, may comprise, as a non-limiting example, an electronic tilt sensor mounted to the dozer blade, an electronic tilt control operable to receive a signal from the electronic tilt sensor, an electrically operated hydraulic control responsive to the electronic tilt control, an adjustable hydraulic flow controller operable for selectively controlling an amount of hydraulic fluid flow to the electrically operated hydraulic control and an amount diverted bank to a hydraulic fluid tank, at least one limit switch to electronically limit a range of operation of the electronic tilt control whereby the at least one limit switch provides an electronically predetermined limit of the right tilt and the left tilt and/or a null control operable to set a desired tilt angle for the dozer blade, whereby the electronic tilt control provides signals to the electrically operated hydraulic control unless the dozer blade is at the desired tilt angle, which is an electronic null position.

In one embodiment, the electronic tilt sensor comprises a first variable pulse width generator that produces variations in pulse width in response to variation of a tilt angle of the dozer, and wherein the electronic tilt control comprises a second variable pulse width generator with a pulse width controlled by the null control.

A logic circuit is preferably operable to separate left tilt pulse width control signals from right tilt pulse width control signals in response to receipt of signals from the first variable pulse width generator and the second variable pulse width generator.

The control may further comprise a pulse width multiplier operable to multiply a pulse width of the left tilt pulse width control signals and the right tilt pulse width control signals.

In one embodiment, the pulse width multiplier comprises an FET utilized as part of an RC circuit for use with a one-shot circuit.

In one embodiment, the electronic tilt control is operable for producing right tilt signals pulse width modulation signals and left tilt pulse width modulation signals, which are utilized for charging respective right tilt and left tilt capacitors. In yet another embodiment, a right tilt, left tilt, null control for a dozer blade, may comprise an electronic tilt sensor mounted to the dozer blade, an electronic tilt control operable to receive a signal from the electronic tilt sensor, the electronic tilt control utilizing a plurality of pulse width modulated signals, an electrically operated hydraulic control responsive to the electronic tilt control, a null control operable to set a desired tilt angle for the dozer blade and/or at least one electronic limit switch to limit a maximum tilt angle for the dozer blade.

A logic circuit, which itself does not generate pulse width modulated signals, is preferably operable to separate left tilt pulse width control signals from right tilt pulse width control signals in response to receipt of signals from a plurality of pulse width generators.

The control may further comprise a pulse width multiplier operable to multiply a pulse width of the left tilt pulse width control signals and the right tilt pulse width control signals.

In yet another embodiment, a variable pulse width generator may comprise a one shot circuit, which is triggered to produce an output pulse by an incoming pulse. An output pulse width control for the one shot circuit may comprise an FET which forms part of a resistor capacitor circuit for controlling the output pulse width.

The variable pulse width generator may further comprise a gate for the FET operable for receiving a signal for controlling the output pulse width.

In one embodiment, the variable pulse width generator is configured to multiply or divide an incoming pulse width by a predetermined amount whereby the output pulse has a width either multiplied or divided by the predetermined amount applied to a width of the incoming pulse.

The variable pulse width generator may comprise a capacitor, which charges in response to an incoming variable pulse width, and a gate for the FET operable connected to the capacitor.

In yet another embodiment, a pulse width translator or multiplier and/or divider circuit is provided which may be utilized for multiplying or dividing a variable pulse (or a fixed width pulse) by a preset amount (e.g. 100) and/or by a selectable amount and/or by a real time variable amount.

While the present invention will be described in connection with presently preferred embodiments, it will be understood that it is not intended to limit the invention to those embodiments. On the contrary, it is intended to cover all alternatives, modifications, and equivalents included within the spirit of the invention and as defined in the appended claims.

DETAILED DESCRIPTION OF THE PREFERRED EMBODIMENTS

While the invention may be implemented with 6-way blade control, the description provided below describes the system for automatically controlling the tilt of the blade. Circuitry and implantation of up & down, as well as angle of the blade, could be made with similar circuitry as discussed below for right and left tilt of the blade and/or as discussed in the applications that are incorporated herein by reference, as per the first paragraph of the application.

Figure 1:
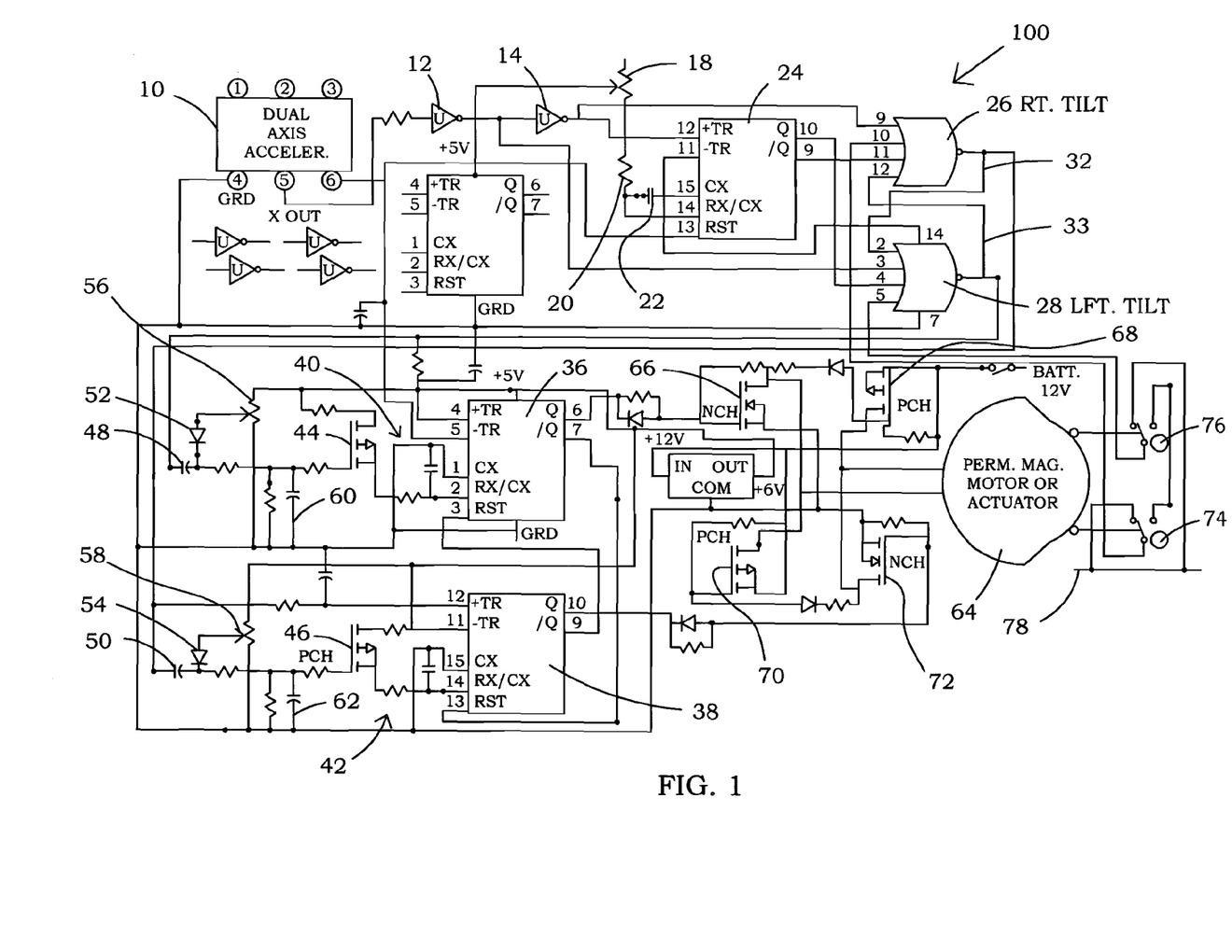
FIG. 1 is a circuit diagram that shows electronic controls for tilt and null controls in accord with one possible embodiment of the present invention.

Referring now to the drawings and more particularly to FIG. 1, there is shown electronic control system 100, which may be utilized to provide control signals for the bull dozer blade.

In U.S. patent application Ser. No. 12/506,478, filed Jul. 21, 2009, a multiple pulse width electronic control circuit is shown, which may utilize a reference pulse generator and a resistor control, which produces a DC control signal rather than a pulse width modulation output signal from the sensor.

Figure 2:
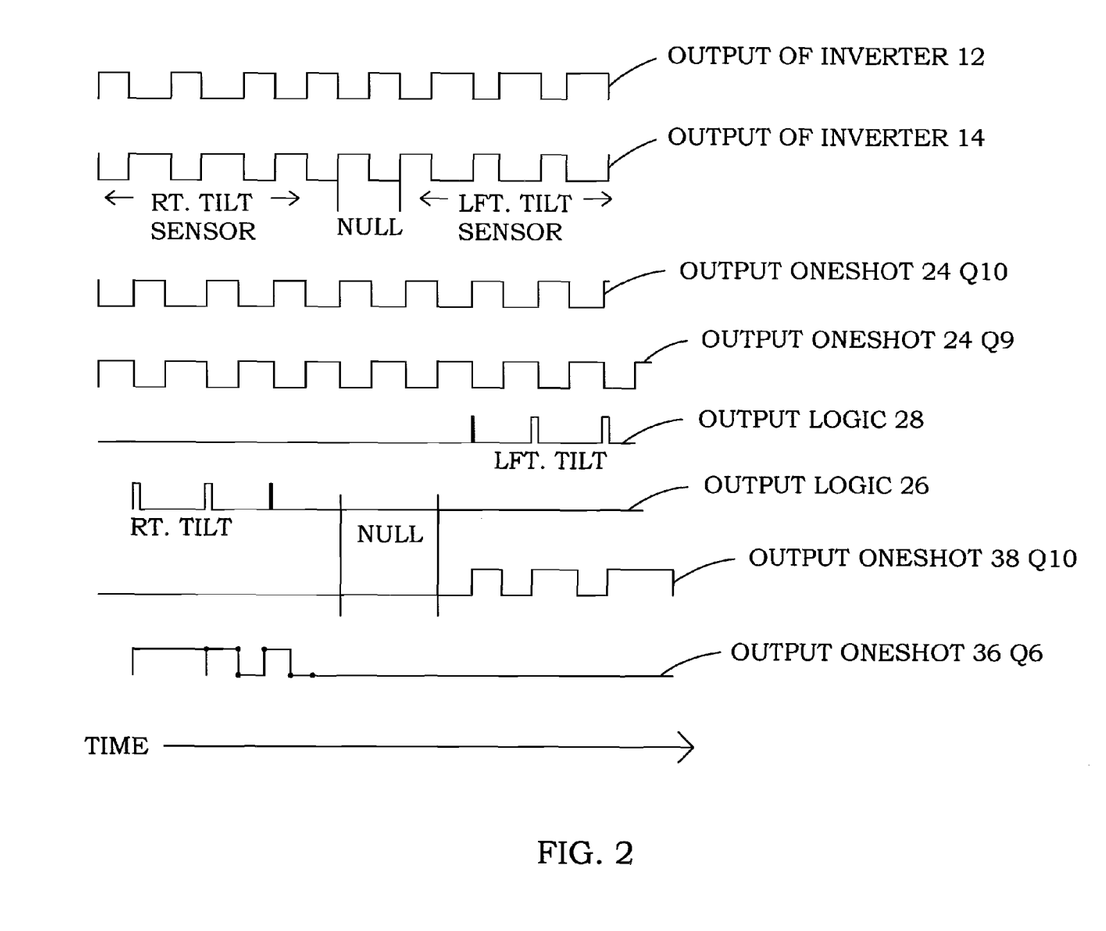
FIG. 2 is a timing diagram that shows signals produced at selected points of FIG. 1 in accord with one possible embodiment of the present invention.

In one embodiment of the present invention, instead of a DC signal, accelerometer 10 produces pulse width modulated signals comprising a repeating pulse width modulated wave with the pulse width that varies with the angle of the dozer blade. For example, a 100 millisecond pulse output of accelerometer 10 may be varied by 0 to 1 milliseconds depending on the tilt position of accelerometer 10, which is mounted to the dozer blade, with one possibility being shown in FIG. 3. The pulse width modulated signal goes though inverters 12 and 14. Accelerometer output applied to inverter 12 is shown in FIG. 2 as seen at the output of inverter 12. Inverter 14 output is shown in FIG. 2, which is the inverted output of inverter 12.

While the present embodiment utilizes accelerometer 10, other types of position sensors could also be utilized, some of which may utilize a DC type of output signal that varies with angular position of the dozer blade.

Variable resistor 18 is utilized to set the desired tilt, whereupon a null is produced when the blade is at the desired position. At null, the control signals seen in FIG. 2, which may broadly include the output of logic 26 and one shot 36 for right tilt pulses, and the output of logic 38 and one shot 38 at Q10 for left tilt pulses, will be zero or null. Lines 32 and 33 are connected so that at null, spurious pulses are not produced, so that the dozer blade remains in the null position.

The variable resistor reference tilt control 18 can be used as a zero or null reference to set the dozer blade to crown a road or cut a ditch with a slope relative to the zero or null reference. Variable resistor 18, along with resistor 20 and capacitor 22 control the output pulse width of variable width pulse generator 24, in this case a one-shot integrated circuit. A pulse generator as used herein is a device that is operable for varying a width of a pulse output based on a DC control signal, such as variable resistor 18. Accelerometer 10 is also considered a pulse generator because the output pulse width is varied with respect to the position of the blade. The output Q and not Q of one shot 24 is shown in FIG. 2 as output one shot 24 Q10 and output one shot 24 Q9.

Logic circuitry 26 and 28 are utilized for separating the right tilt, left tilt, and null signals as indicated by output logic 26 and output logic 28 in FIG. 2. Logic circuitry 26 and 28 are not variable width pulse generators because the width of the pulses is predetermined by input pulses from one shot 24 and accelerometer 10. In this example, logic circuitry 26 and 28 are utilized to separate x-axis left tilt from x-axis right tilt and null. A more detailed discussion of how the logic circuitry effects this separation is provided in previously mentioned U.S. patent application Ser. No. 12/506,478, which as noted earlier is incorporated herein by reference. Essentially, a difference in the pulse width of one shot 24 as compared to the pulse width of accelerometer 10 results in right tilt and left tilt pulses as shown output logic circuit 28 and 26 shown in FIG. 2. The larger the pulse, the longer the motor will operate. So smaller pulses are produced as the blade is moved to the desired position until the pulses stop in the null position once the blade is at the desired level. FIG. 2 shows a constant one-shot 24 pulse duration output (Q10, Q9), which is determined by resistor 18, as compared to accelerometer 10 output (12, 14) whereby right tilt and left tilt control signal outputs are produced.

Lines 32 and 33 connect between gates 26 and 28 to provide anti-coincidence control to prevent pulses being produced at null and during any other situation. Output waveform from logic circuit 28 (in this case a NAND gate) from FIG. 2 separates the left tilt control signal from one shot 24 and inverter 12 shown in FIG. 1. Output waveform from logic circuit 26 from FIG. 2 separates the right tilt control signals from one shot 24 and inverter 14 shown in FIG. 1.

However, the 0 to 1 millisecond output pulse width change produced by accelerometer 10 has a duration that is too short to be useful as an actuator signal because the pulse widths are not long enough to operate the hydraulic actuator, which may be a solenoid valve, electro-hydraulic control, motor, or the like, operable to control or move the dozer blade. The pulse durations of output logic 28 and output logic 26, as shown generally in FIG. 2, are not sufficiently wide to operate the motor with sufficient response speed.

Therefore, one shots 36 and 38 of FIG. 1 are used in multiplier circuits to multiply the pulse durations or width of the output logic 28 and output logic 26, as shown generally in FIG. 2, to produce control signals as indicated as output one shot 38 at Q10 and output one shot 36 at Q6 shown in FIG. 2, whereby the multiplied pulse widths may be in the general range of 40 to 100 milliseconds. The duty cycle may now be 100% on, if desired, whereby with a duty cycle of 100% the motor operates continuously over the frequency of the pulsed signal to move the hydraulic actuator more quickly to the desired position. Accordingly, the one shot circuits 36 and 38 in this case are used to multiply the pulse durations or width of the output logic 28 and output logic 26 by a desired predetermined amount, e.g., by 100. While not needed in the present embodiment, the circuitry could also be utilized to divide pulses by a predetermined amount.

The multiplier circuit of one shot circuits 36 and 38 as controlled by FETs 44 and 46 that act as a capacitor or resistor is considered to be another unique feature of the present invention, which has applications outside of the present invention and could be utilized in any application requiring pulse width modulation generators, and/or the basis of operation of pulse width modulation generators within integrated circuits.

The output pulse widths of one shots 36 and 38 are partially controlled by fixed resistors and capacitors, such as those indicated 40 and 42. However, p-channel FET 44 and 46 are used as variable resistors (in this example although they could be used as variable capacitors) to provide the desired pulse width multiplication adjustment, which varies due to a varying input voltage signal. This arrangement is considered unique.

In this embodiment, the input voltage to p-channel FET 44 and 46 is approximately 1.6 volts and the minimum signal level for 34 and 35 is approximately 0.5 volts. To pull the voltage up, capacitors 48 and 50 and diodes 52 and 54 form clamp circuits which effectively set the minimum voltage level of 34 and 35 to 1.6 volts with the maximum voltage being determined by the amplitude of signals 34 and 35. When signals 34 and 35 are at the zero level, one-shots 36 and 38 are not triggered.

The clamped voltage controlled by variable resistors 56 and 58 charge capacitors 60 and 62.

Accordingly, it will be noted that the basic FET controlled one-shot circuit has uses outside of the present application for use in providing an FET controlled one-shot wherein the FET can act as a variable resistor and/or capacitor to control the pulse width and is considered to be unique in itself.

In this embodiment, outputs from one shots 36 from Q6 and 38 Q10, seen in FIG. 2, are applied to solid state double pole double throw relay to drive actuator 64 (or motor).

One shot 36 connects to FET 66 and FET 68, which when pulsed will connect the n-channel drain to ground and also ground the gate of p-channel drain to ground. These points are connected to coils on actuator or motor 64 to tilt the blade in the right direction.

One shot 38 connects to FET 70 and FET 72 to drive n-channel FET 72 causing the blade to tilt in the left direction.

Left and right limit switches 74 and 76 connect to gates 26 and 28 from which the left and right tilt drive pulse width modulated signals are separated for output as discussed hereinbefore. In this way, limit switches 74 and 76 may be used to prevent and/or limit the output of gates 26 and 28 to limit the range of the tilt to a desired amount. Limit switches 74 and 76 may be of various types. In one embodiment, limit switches 74 and 76 may be cam operated, as indicated in FIG. 1, although they could also be gravity controlled switches.

In one embodiment, limit switches 74 and 76 may limit the electronic circuit range of control of right tilt and left tilt to 10 degrees in one embodiment so that the dozer blade does not tilt more than 10 degrees with respect to the dozer body. Once the range is reached, then the respective limit switch applies a signal to the input of the respective gate to shut off further output of the respective gate for control signals. For example, once the limit for left limit switch 74 is reached, then a signal is applied to the input of left tilt gate 26 to prevent further left tilt movement.

Another signal from line 78 may be utilized to effectively shut off electronic control 100 by preventing signals being produced by gates 26 and 28 until the engine oil pressure is high enough for operation, whereupon operation of gates 26 and 28 is then allowed.

The null power loss of the circuit is only about ½ watt making for a long lasting and reliable circuit. The accuracy of the control is about 1/16 degree. One possible embodiment of the dozer blade system is based on the use of pulse durations for driving the motor backward or forward for right tilt and left tilt, and the absence of pulse duration to cause the motor to be stationary or nulled. The width of the pulses determines how fast, far, and/or quickly the blade moves when trying to correct the position. While the invention here utilizes a bull dozer blade, the invention may be applied for servo control of both small and large motors with the same basic design and the use of relays, power transistors, and FETs for driving the motor.

Figure 3:
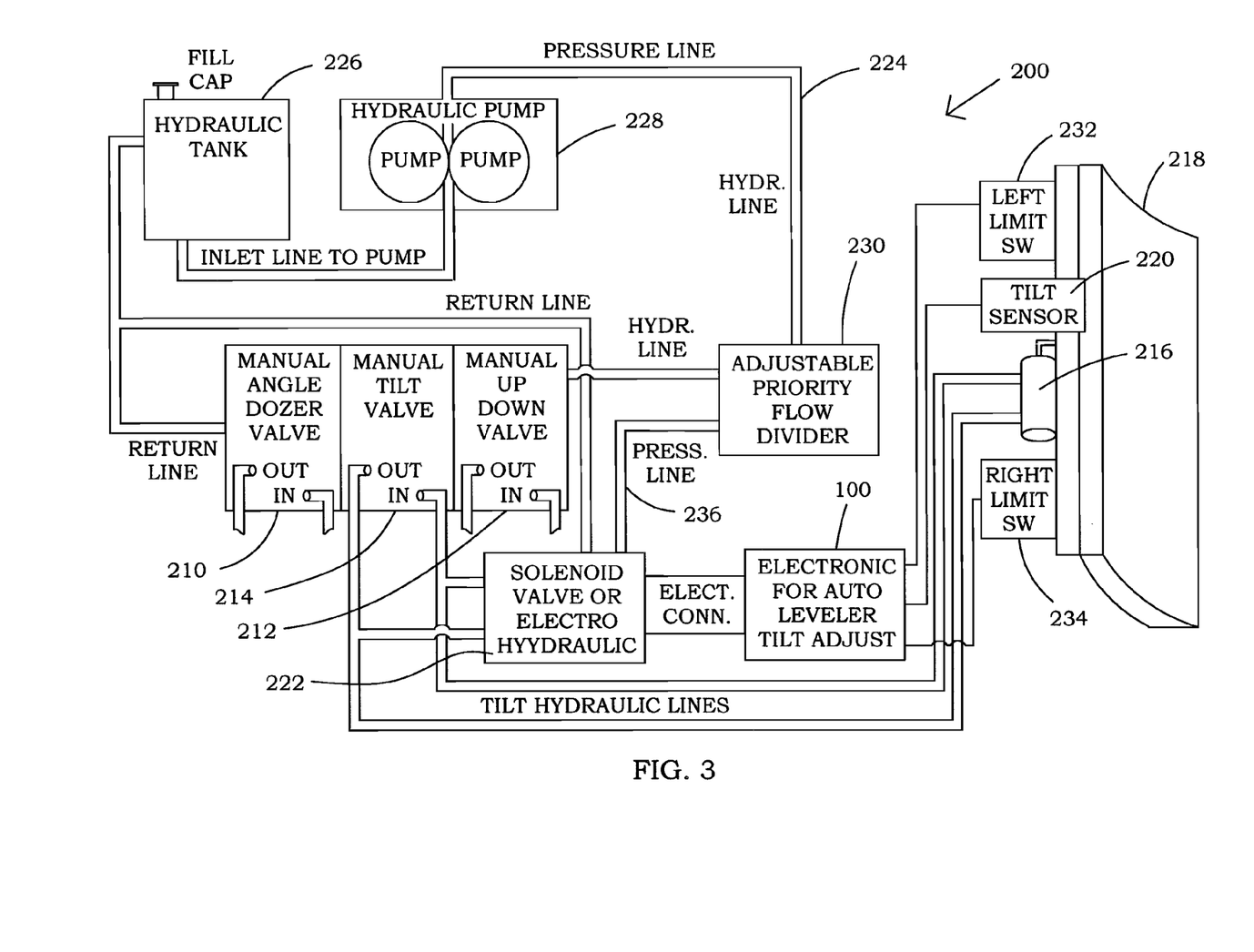
FIG. 3 is a system diagram which shows hydraulic and electrical connections of components of the system in accord with one possible embodiment of the present invention.

Referring now to FIG. 3, there is shown an overall hydraulic control system with electronics 100 described hereinbefore with respect to other components of bulldozer tilt control system 200. For simplicity, hydraulic and electronic circuitry for manual blade angle control 210 and up down control 212 are not shown although these could generally be similar in pulse width control operation, in accord with one embodiment.

Manual tilt control 214 connects via hydraulic lines to both sides of tilt hydraulic cylinder 216, which is mounted to dozer blade 218 in a manner to manually control right tilt, left tilt, and level. Manual tilt control 214 can override the automatic tilt control and/or the automatic control can be turned off and/or the manual signal can be input with the automatic control then returning the blade to the adjusted position. Thus, automatic tilt control, using solenoid valve or other electro hydraulic control 222, can, in one embodiment, override the manual control 214. In this embodiment, solenoid valve or other electro hydraulic control 222 connects to the same hydraulic lines.

Tilt sensor 220, which may be of various types including gravity sensor, accelerometer, multiple sensors in an array, or the like, is secured to dozer blade 218 to measure the tilt of the dozer blade. In the present invention, a simple low cost sensor can be utilized. In one possible embodiment, sensor 10 discussed in FIG. 1, is utilized as the desired tilt sensor 220 but other tilt sensors could be utilized. Tilt sensor 220 is connected to electronics 100 as discussed hereinbefore. In this embodiment, electronics 100 provides a null or zero tilt adjustment the operation of which is discussed hereinafter, which would be null adjust 18 discussed hereinbefore.

Electronics 100 provides an output to solenoid valve or electro-hydraulic operator 222, which in one possible embodiment is actuator 64 shown in FIG. 1. To help stabilize the automatic tilt control system, in one embodiment, hydraulic line 224 from reservoir 226 and pump 228 is passed through adjustable priority flow divider 230 to provide hydraulic control of the response time of electronic circuit 100, tilt sensor 220, and solenoid valve 222. By providing less flow to solenoid valve 222 via hydraulic line 236 with more hydraulic fluid returning to hydraulic tank 226, the reaction time of the system is damped or made more sluggish, which improves stability. Reaction time can be increased by providing greater flow to solenoid valve 222. In one embodiment, about 10% of the hydraulic fluid is directed hydraulic line 236, with about 90% being returned to hydraulic tank 226. However, any percentage or range of percentage of fluid may be utilized for this adjustment to stabilize the system operation.

In many tractor and bulldozer designs, the maximum tilt for a manually controlled blade may be limited, such as for example only, in the range of about 10 degrees for right and left tilt. Other maximum tilt ranges may comprise any range of angles between zero and forty five degrees maximum tilt.

In this embodiment of automatic tilt electro-hydraulic system 200, left limit switch 232 and right limit switch 234 are utilized to prevent overloading of the hydraulic system and still allow control in the tilt adjustable range of electronics 100. Left limit switch 232 and right limit switch 234 are connected to electronics 100 as discussed hereinbefore and electronically limit the range of operation tilt operation of electronics 100 to a predetermined limit, e.g., as a non-limiting example only, 10 degrees right tilt and 10 degrees left tilt. Any desired limit may be utilized to place the range within the hydraulic-mechanical range of operation of the bull dozer blade. Left limit switch 232 and right limit switch 234 may be button controlled or cam controlled switches as indicated by limit switches 74 and 76 in FIG. 1. Other types of limit switches could also be utilized such as gravity switches, potentiometers, or the like.

As one possible example of operation multiple passes of the bulldozer may be used. For example, with use of limit switches of 10 degrees, to cut a 20 degree left slope, null control 18 may be set at 5 degrees for a first pass, whereby null occurs when the blade has a 5 degrees left slope. In other words, the bulldozer blade will attempt to move to null at 5 degrees. The automatic control will maintain the blade in the 5 degree position with respect to a ground based framework, such as a fixed x-y-z framework relative to Earth, even though the bull dozer may move relative to the fixed x-y-z framework during travel. Thus a five degree slope is created after the first pass. Once the first pass is completed, then the bull dozer will be traveling over the same ground that already has a 5 degree slope. So, the same 5 degrees may be used for a second pass over the already sloped ground resulting in a 10 degree left slope. The same 5 degree null adjustment is then for a third pass and a final pass of 5 degrees, which results in the 20 degree left slope, with respect to the x-y-z framework even though the tilt of dozer blade 218 with respect to the bulldozer body is only 5 degrees. The control of claim 12, wherein said tilt signal is produced with an initial smaller angle between said bull dozer body and said bull dozer blade than an actual angle between said bull dozer blade and said fixed frame work.

In other words, the initial setting of adjustment 18 will be for 5 degrees with respect to the dozer body, which is rearward of dozer blade 218 in FIG. 3, but tilt sensor 220 effectively then measures angle changes independent of the dozer body, with respect to gravity and/or a fixed x, y, z framework such as an Earth based framework. In one embodiment, the system is switched off and then turned on when the bull dozer body is on the newly created slope. So, the adjustment is made in a static position, with the accelerometer being able to measure changes in that position. An ending banked angle of 20 degrees is produced even though the null setting is for 5 degrees on each pass. Working with a gravity based sensor rather than an accelerometer can be made with different procedures but with the controls operated in a different manner.

As noted above, accuracy for sensor 10 of FIG. 2, mounted on dozer blade 218 is 1/16 of a degree. As per the discussion of FIG. 2, sensor 10 outputs a 100 millisecond pulse with varies plus or minus 1 millisecond depending on the amount and direction of tilt. One shot 24 produces a reference pulse via null adjustment 18 which sets the desired blade angle and maintains the blade angle automatically.

It is also to be understood that the foregoing descriptions of preferred embodiments of the invention have been presented for purposes of illustration and explanation and it is not intended to limit the invention to the precise forms disclosed. It is to be appreciated therefore that various structural and circuit changes, many of which are suggested herein, may be made by those skilled in the art without departing from the spirit of the invention.

What is claimed is:

1. A variable pulse width generator comprising:
   a one shot circuit, said one shot circuit being triggered to produce an output pulse by an incoming pulse;
   an output pulse width control operably connected to said one shot circuit, said output pulse width control comprising an FET which forms part of a resistor capacitor circuit for controlling said output pulse width.

2. The variable pulse width generator of claim 1, further comprising:
   a gate for said FET operable for receiving a signal for controlling said output pulse width.

3. The variable pulse width generator of claim 2, further comprising a variable resistor or variable capacitor being operatively connected to said FET to vary said output pulse width.

4. The variable pulse width generator of claim 1, wherein said variable pulse width generator is configured to multiply or divide an incoming pulse width by a predetermined amount whereby said output pulse has a width either multiplied or divided by said predetermined amount applied to a width of said incoming pulse.

5. The variable pulse width generator of claim 1, comprising a capacitor which charges in response to an incoming variable pulse width, a gate for said FET operable connected to said capacitor.

6. The variable pulse width generator of claim 1, wherein said incoming pulse comprises a pulse duration that changes from 0 to 1 milliseconds and from 20 to 40 or 40 to 100 milliseconds.

7. A method for providing a variable pulse width generator comprising:
   providing a one shot circuit;
   providing that said one shot circuit being triggered to produce an output pulse by an incoming pulse;
   providing that an output pulse width control is operably connected to said one shot circuit; and
   providing that said output pulse width control comprises an FET which forms part of a resistor capacitor circuit for controlling a width of said output pulse.

8. The method of claim 7, further comprising:
   providing that a gate for said FET is operatively connected for receiving a signal for controlling said width of said output pulse.

9. The method of claim 8, further comprising providing a variable resistor or variable capacitor operatively connected to said FET to vary said width of said output pulse.

10. The method of claim 7, further comprising
    configuring said variable pulse width generator to multiply or divide an incoming pulse width by a predetermined amount whereby said output pulse has a width either multiplied or divided by said predetermined amount applied to a width of said incoming pulse.

11. The method of claim 7, comprising providing a capacitor which charges in response to an incoming pulse width, and providing that a gate for said FET is operably connected to said capacitor.

12. The method of claim 7, comprising configuring said output pulse width control so that said incoming pulse comprises a pulse duration that changes from 0 to 1 milliseconds and said width of said output pulse changes from 20 to 40 or 40 to 100 milliseconds.

13. A variable pulse width generator comprising:
    a one shot circuit, said one shot circuit being triggered to produce an output pulse in response to an incoming pulse; and
    an output pulse width control operably connected to said one shot circuit, said output pulse width control comprising an FET and at least one resistor and capacitor, said FET and said at least one resistor and capacitor being connected together and to said one shot circuit to control a width of said output pulse.

14. The variable pulse width generator of claim 13 further comprising said output pulse width control further comprising at least one of a variable resistor or capacitor.

15. The variable pulse width generator of claim 13 wherein said one shot circuit is formed within an integrated circuit.

* * * * *